(12) United States Patent
Scharner et al.

(10) Patent No.: US 10,177,331 B2
(45) Date of Patent: Jan. 8, 2019

(54) METHOD FOR PRODUCING AN ORGANIC LIGHT-EMITTING DIODE, AND ORGANIC LIGHT-EMITTING DIODE

(71) Applicant: OSRAM OLED GmbH, Regensburg (DE)

(72) Inventors: Silke Scharner, Regensburg (DE); Carola Diez, Regensburg (DE); Dominik Pentlehner, Regensburg (DE); Ulrich Niedermeier, Leiblfing (DE)

(73) Assignee: OSRAM OLED GMBH, Regensburg (DE)

( * ) Notice: Subject to any disclaimer, the term of this patent is extended or adjusted under 35 U.S.C. 154(b) by 84 days.

(21) Appl. No.: 15/118,086

(22) PCT Filed: Feb. 10, 2015

(86) PCT No.: PCT/EP2015/052747
§ 371 (c)(1),
(2) Date: Aug. 10, 2016

(87) PCT Pub. No.: WO2015/121247
PCT Pub. Date: Aug. 20, 2015

(65) Prior Publication Data
US 2016/0359127 A1    Dec. 8, 2016

(30) Foreign Application Priority Data

Feb. 11, 2014  (DE) .................. 10 2014 101 650

(51) Int. Cl.
*H01L 51/50*  (2006.01)
*H01L 51/00*  (2006.01)
(Continued)

(52) U.S. Cl.
CPC ............ *H01L 51/504* (2013.01); *C09K 11/06* (2013.01); *H01L 51/0003* (2013.01);
(Continued)

(58) Field of Classification Search
CPC .... B05D 1/007; H01L 51/0003; H01L 51/504
(Continued)

(56) References Cited

U.S. PATENT DOCUMENTS 4,839,032 A * 6/1989 Whitlock .................. B03C 7/00
209/11
2009/0050199 A1   2/2009 Bartholomew et al.
(Continued)

OTHER PUBLICATIONS

Zhen C. et al. , Incorporation of electroluminescence and electrochemiluminescence in one organic light-emitting device, Applied Physics Letters, Aug. 2005, 87, 093508.*
(Continued)

*Primary Examiner* — Alex A Rolland
(74) *Attorney, Agent, or Firm* — McDermott Will & Emery LLP

(57) ABSTRACT

The invention relates to a method for producing an organic light-emitting diode (1) comprising the following steps: providing a carrier (3) for the organic light-emitting diode (1), applying a solution (S) comprising a plurality of different emitter materials (E) to the carrier (1), wherein said emitter materials (E) are each formed by a certain type of organic molecule and have electrical charges that differ from each other, applying an electrical field (F), so that the solution is located in the electrical field (F), and drying the solution (S) into a plurality of emitter layers (20) in an organic layer stack (2), while the electrical field is applied, so that the emitter materials (E) are accommodated separately from each other, each in a certain emitter layer (20) of the organic stack (2).

11 Claims, 2 Drawing Sheets

Figure 1:
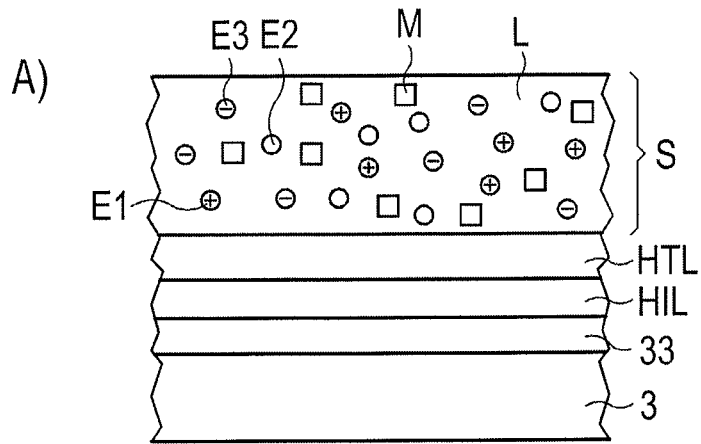
Figure 1:
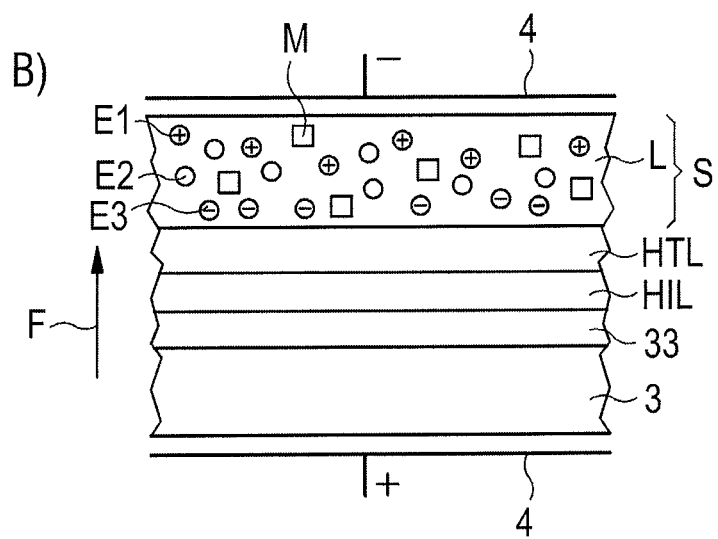
Figure 1:
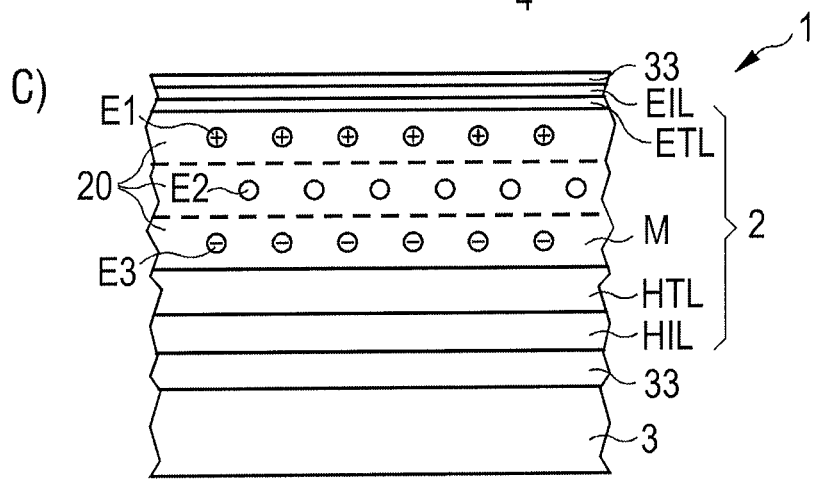

(51) Int. Cl.
*C09K 11/06* (2006.01)
*H01L 51/56* (2006.01)

(52) U.S. Cl.
CPC ...... *H01L 51/0007* (2013.01); *H01L 51/0085* (2013.01); *H01L 51/0088* (2013.01); *H01L 51/5032* (2013.01); *H01L 51/56* (2013.01); *C09K 2211/185* (2013.01); *H01L 51/5012* (2013.01); *H01L 2251/5346* (2013.01)

(58) Field of Classification Search
USPC .......................................................... 427/458
See application file for complete search history.

(56) References Cited

U.S. PATENT DOCUMENTS

| | | | |
|---|---|---|---|
| 2010/0059740 A1 | 3/2010 | Yersin et al. | |
| 2010/0173134 A1* | 7/2010 | Khokhlov | H01L 51/442 428/174 |
| 2012/0169213 A1 | 7/2012 | De Cola et al. | |
| 2013/0046096 A1 | 2/2013 | De Cola et al. | |

OTHER PUBLICATIONS

Carlson, B. et al., "Divalent Osmium Complexes: Synthesis, Characterization, Strong Red Phosphorescence, and Electrophosphorescence", Journal of the American Chemical Society, vol. 124, 2002, No. 47, pp. 14162-14172.

He, L. et al, "Highly Efficient Blue-Green and White Light-Emitting Electrochemical Cells Based on a Cationic Iridium Complex with a Bulky Side Group", Chemistry of Materials, vol. 22, 2010, No. 11, pp. 3535-3542.

Zhen, C. et al, "Incorporation of Electroluminescence and Electrochemiluminescence in One Organic Light-Emitting Device", Appl. Phys. Lett., 87, 2005, pp. 093508-1-093508-3.

Bolink, H. et al., "Green Light-Emitting Solid-State Electroherncial Cell Obtained from a Homoleptic Iridium (III) Complex Containing Ionically Charged Ligands", Journal of the American Chemical Society, vol. 18, 2006, No. 12, pp. 2778-2780.

* cited by examiner

METHOD FOR PRODUCING AN ORGANIC LIGHT-EMITTING DIODE, AND ORGANIC LIGHT-EMITTING DIODE

A method for producing an organic light-emitting diode is provided. A light-emitting diode produced accordingly is also provided.

A problem addressed by the invention is to provide a method by means of which an organic light-emitting diode can efficiently be produced.

This problem is solved, inter alia, by a method with the features of claim 1. Preferred further developments are the subject matter of the dependent claims.

According to at least one embodiment, the organic light-emitting diode is set up for generating visible light. For example, white light is emitted by the light-emitting diode during operation. It is also possible for colored light, for example blue light, red light, yellow light or green light, to be emitted by the light-emitting diode.

According to at least one embodiment, the method comprises the step of providing a carrier for the organic light-emitting diode. The carrier is preferably the component of the light-emitting diode that mechanically supports and carries the light-emitting diode. It is not imperative that the carrier is a mechanically rigid carrier. Said carrier can also be mechanically flexible, in particular bendable.

For example, the carrier is a glass or plastic plate. The carrier is in particular radiolucent for any radiation generated during operation of the light-emitting diode.

According to at least one embodiment of the method, a solution is applied to the carrier. The solution comprises two or more than two different emitter materials. Said emitter materials are set up in such a way as to generate radiation via fluorescence or phosphorescence when the light-emitting diode is in operation. The emitter materials are, for example, each formed by a certain type of organic molecule.

According to at least one embodiment, all the emitter materials have electrical charges that differ from each other. Thus, at least one of the emitter materials, preferably a plurality of the emitter materials, has an electrical charge other than zero. In other words, at least one of the emitter materials is an ionic material.

According to at least one embodiment of the method, an electrical field is applied, so that the solution is located in the electrical field. The electrical field is preferably a static electrical field.

According to at least one embodiment of the method, the latter comprises the step of drying the solution into at least two or more than two emitter layers. Said emitter layers are located in an organic layer stack of the completed organic light-emitting diode.

According to at least one embodiment, the electrical field is applied before and/or during the drying of the solution. Due to the electrical field, the differently electrically charged emitter materials are accommodated separately from each other, or substantially separately from each other, each in a certain emitter layer of the organic stack. In other words, the electrical field allows the emitter materials to be separated from each other before and/or during the drying of the solution, in particular in a parallel direction to the field lines of the electrical field.

According to at least one embodiment of the method, the latter is set up for producing an organic light-emitting diode. The method comprises at least the following steps, preferably in the stated sequence:

providing a carrier for the organic light-emitting diode,
applying a solution comprising a plurality of different emitter materials to the carrier, wherein said emitter materials are each formed by a certain type of organic molecule and have electrical charges that differ from each other,
applying an electrical field, so that the solution is located in the electrical field, and
drying the solution into a plurality of emitter layers, which are located in an organic layer stack of the completed light-emitting diode, while the electrical field is applied, so that the emitter materials are accommodated separately from each other, each in a certain emitter layer of the organic stack.

During a conventional generation of an organic light-emitting diode by means of liquid phase deposition, the application of a plurality of successive organic layers, specifically emitter layers, is often problematic. A selection of the solvents to be used is in particular restricted by the fact that some materials are only soluble in selected solvents. Furthermore, an already applied layer can be partially dissolved when applying the next layer. Thus, for instance, layers applied with the aid of a polar solvent can also be dissolved by a layer with a polar solvent. The result is that no more defined limiting surfaces are present between the different layers, which can lead to a mixing of the layers or to fluctuations in concentration. This can go hand in hand with a reduction in the efficiency of the organic light-emitting diode. A mixing of different emitter materials in one layer is usually undesired, as this promotes an energy transfer of higher energetically to lower energetically emitting materials.

In the method described herein, differently emitting molecules are separated from the solution, comprising the emitting molecules and preferably a matrix material as well. However, on the basis of the differing charges and due to the applied electrical field, the emitting molecules arrange themselves into separated layers, thus generating a layer stack made of a plurality of successive single emitter layers.

In order to achieve this, emitter materials with different charges are used. To this end, known, conventional, neutral emitter materials of organic light-emitting diodes with suitably charged side groups could be substituted or even charged emitter materials could be used, which are not usually used in organic light-emitting diodes produced by evaporation due to the high vaporization temperatures thereof. This would also allow ionic emitters, comprising light-emitting electrochemical cells (LEECs) to be used.

According to at least one embodiment, the solution comprises an organic matrix material for the emitter materials, the emitter materials as well as counter ions for at least one of the emitter materials. The solution also contains at least one solvent. Preferably, all emitter layers of the organic light-emitting diode are generated from the precisely one solution. All emitter layers can then be generated in a single application step and drying step.

According to at least one embodiment, the solvent is a polar solvent. In particular, the solvent is an aryl-alkyl-ether, such as phenetole or anisole. The solvent can, however, also be a diether, in particular an alicyclic diether, such as dioxane. Furthermore, mixtures of a plurality of solvents can also be used for the solution.

According to at least one embodiment, the ion mobilities of the counter ions and in particular of the associated emitter materials or of all emitter materials do not deviate much from each other. This applies in particular in the solvent and during the drying step. The ion mobilities preferably deviate from each other by a maximum of 25% or 15% or 7.5% or 5%.

According to at least one embodiment, the counter ions have an average molecular volume equaling at least 50% or 70% or 85% or 92% of an average molecular volume of the molecules of the emitter materials. For example, the counter ions are formed by inorganic counter ions such as $PF_6^-$ or by organic counter ions with large substituents, such as tertiary butyl, wherein modifications thereof can also be used. It is also possible that a plurality of different types of counter ions are present in the solution. For example, one type of counter ion is assigned to each charged emitter material or the same type of counter ion is assigned to all emitter materials.

According to at least one embodiment, one of the emitter materials is a metal complex or all the emitter materials are metal complexes. The at least one metal complex complies with the formula $[(L_{CH})_xMX_y]^{n-}$ or $[(L_{CH})_xMX_y]^{n+}$, wherein M is a metallic ion from the group Mo, Ru, Rh, Pd, Ag, W, Re, Os, Ir, Pt, Cu, Au and lanthanides. $L_{CH}$ is always an independent bidentate chelating ligand. X is in each case an independent single negatively charged monodentate ligand from the group Cl, Br, I, CN, SCN and/or OCN. Furthermore, n, x and y are integers with $1 \leq x \leq 3$, $0 \leq y \leq 6$ and $1 \leq n \leq 4$.

Such emitter materials are known, for example, from the document US 2010/0059740 A1. The disclosure of said document with regard to the emitter materials and the production method of such emitter materials is hereby incorporated by back reference.

According to at least one embodiment, one or more or all of the emitter materials are metal complex compounds. The at least one metal complex compound comprises at least one metallic central atom (M) and at least one ligand coordinated by the metallic central atom M, which is a bidentate ligand with an aromatic unit, wherein an imidazolinium unit is bound to the aromatic unit via a spacer, so that a charged complex results, which binds an anion:

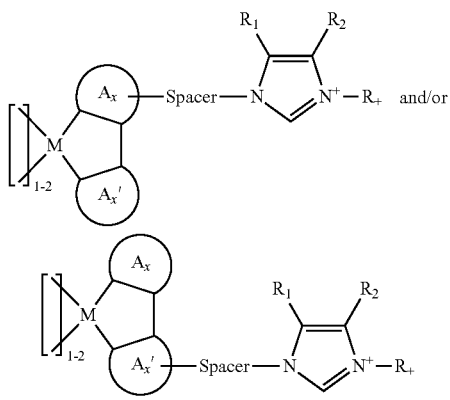

wherein M is selected from the group Mo, Ru, Rh, Pd, Ag, W, Re, Os, Ir, Pt, Cu, Au and lanthanides,
wherein the anion is freely selectable,
wherein the ligands

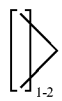

are formed independently of each other analogous to the imidazolinium substituted ligands "Ax-Spacer-Imidazol" or are selected from cyclo metallizing ligands,
wherein Ax, Ax' is a substituted or unsubstituted aromatic or heteroaromatic, which is capable of forming bond relations to the metallic central atom M,
wherein a bond of the metallic central atom to a carbon or nitrogen of the Ax and of the Ax' is illustrated by a solid line,
wherein a bond of the metallic central atom to either a carbene carbon or a nitrogen or phosphor coordinated by a free pair of electrons is represented by a dashed line, wherein
a) aliphatic chains such as $—(CH_2)_n—$ wherein n=1 to 20,
b) fluorinated alkyl chains with 1-12 carbon atoms in the chain,
c) unsaturated alkyl chains with 1-20 carbon atoms and conjugated or non-conjugated double bonds,
d) unsaturated alkyl chains with 1-20 carbon atoms and conjugated or non-conjugated triple bonds, also in conjunction with aromatics,
e) a polyethylene glycol, polyethylene diamine, polyester, polyurethane or polyvinylidene phenyl chain,
f) chains containing aromatics, or
g) mixed variants of a-f,
are used as spacers,
$R_1$, $R_2$, $R_+$ are selected independently of each other from the following group: H, branched alkyl radicals, unbranched alkyl radicals, condensed alkyl radicals, cyclic alkyl radicals, fully or partially substituted unbranched, branched, condensed and/or cyclic alkyl radicals, alkoxy groups, amines, amides, ester, ether, carbonate, aromatics, fully or partially substituted aromatics, heteroaromatics, condensed aromatics, fully or partially substituted condensed aromatics, heterocycles, fully or partially substituted heterocycles, condensed heterocycles, halogens, pseudohalogen, condensed alkyl radicals or fully or partially substituted alkyl radicals.

Such emitter materials are known, for instance, from the document US 2013/0046096 A1. The disclosure of said document with regard to the emitter materials and the production method of such emitter materials is hereby incorporated by reference.

According to at least one embodiment, the emitter materials are selected from the following group:

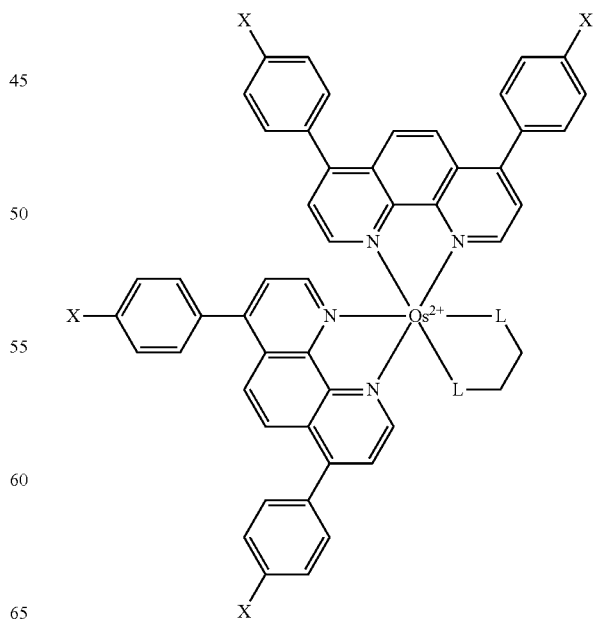

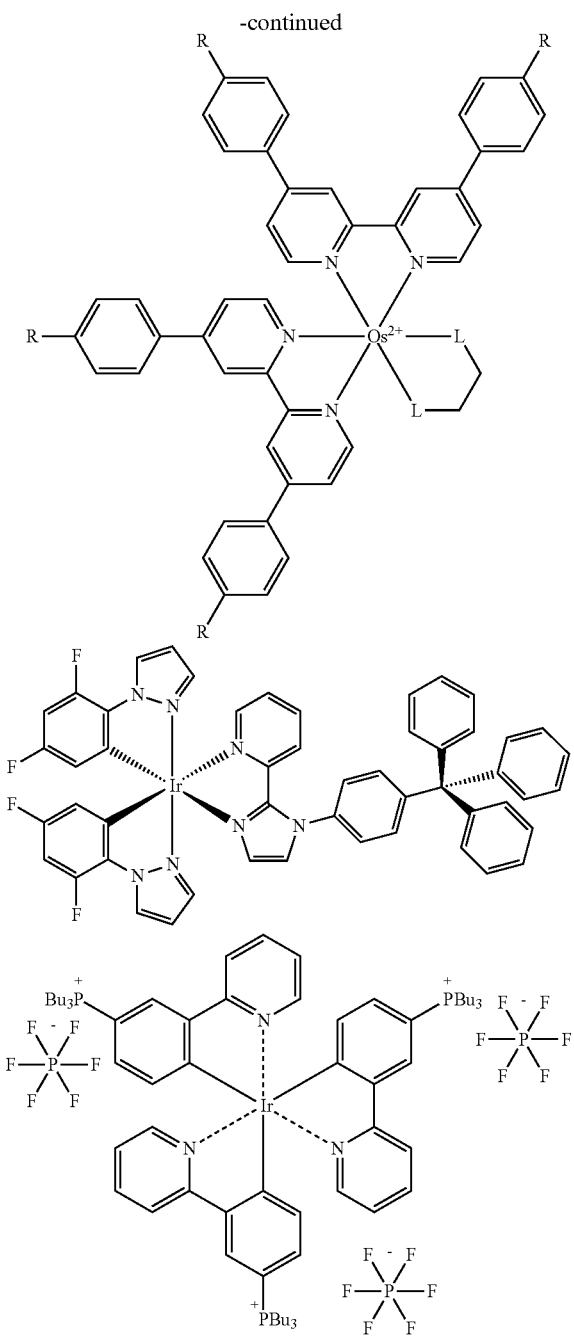

R, X are selected independently of each other from the following group: H, branched alkyl radicals, unbranched alkyl radicals, condensed alkyl radicals, cyclic alkyl radicals, fully or partially substituted unbranched, branched, condensed and/or cyclic alkyl radicals, alkoxy groups, amines, amides, ester, ether, carbonate, aromatics, fully or partially substituted aromatics, heteroaromatics, condensed aromatics, fully or partially substituted condensed aromatics, heterocycles, fully or partially substituted heterocycles, condensed heterocycles, halogens, pseudohalogen, condensed alkyl radicals or fully or partially substituted alkyl radicals. The charged residue groups —$PBu_3^+$ can be replaced independently of each other by other charged residue groups, such as —$NR_3^+$, —$P(R)_3^+$, —$COO^-$, —$P(OR)_4^{2-}$. Furthermore, Ir as well as Os can be replaced by Mo, Ru, Rh, Pd, Ag, W, Re, Pt, Cu, Au and lanthanide. Other counter ions can also be used instead of $PF_6^-$.

Such emitter materials are known from the documents Henk J. Bolink et al., Chem. Mater. 2006, 18, 2778-2780, from Lei He et al., Chem. Mater. 2010, 22, 3535-3542 or from Branden Carlson et al., J. Am. Chem. Soc. 2002, 124, 14162-14172. The disclosure of said documents with regard to the described production method and emitter materials is hereby incorporated by reference.

According to at least one embodiment, the solution has one or more emitter materials for generating blue light. Alternatively or additionally, the solution comprises one of more emitter materials for generating green light and/or one or more emitter materials for generating red light. It is just as possible that the solution comprises at least one emitter material for generating yellow or orange light.

According to at least one embodiment, the solution is applied to the carrier with a layer thickness of at least 2 μm or 5 μm and/or of a maximum of 50 μm or 20 μm. The completely dried emitter layer and/or the completed stack of the emitter layers preferably has a thickness equaling a maximum of 1% or 0.1% of the thickness of the solution.

According to at least one embodiment, the dissolved components in the solution, in particular the dissolved organic components, have a mass fraction of at least 0.1% or 0.5% or 1% with regard to the total solution. Alternatively or additionally, such mass fraction equals a maximum of 4% or 3% or 2%.

According to at least one embodiment, an electrical field strength of the applied electrical field during drying equals permanently or averagely at least 50 V/mm or 100 V/mm or 250 V/mm.

Alternatively or additionally, the field strength equals a maximum of 1500 V/mm or 500 V/mm or 400 V/mm. It is possible that a field strength gradient is applied during drying. For example, the electrical field strength decreases or increases during drying.

In addition, an organic light-emitting diode is provided. Said light-emitting diode is produced by a method as provided in connection with one or more of the above-stated embodiments. Features of the method are thus also disclosed for the organic light-emitting diode, OLED for short, and vice versa.

In at least one embodiment, the organic light-emitting diode comprises an organic layer stack. Said organic layer stack comprises two or more than two emitter materials that differ from each other. Said emitter materials are each formed by a certain type of organic molecule or by a certain mixture of organic molecules. The emitter materials have different electrical charges. Said emitter materials are accommodated separately from each other, each in an emitter layer. The emitter materials are thus preferably present in an unmixed or substantially unmixed state.

Unmixed can mean that a proportion of a certain type of emitter material in the corresponding layer equals at least 80% or 90% or 95% or 99% and that a proportion of other emitter materials in such layer thus equals a maximum of 20% or 10% or 5% or 1%.

According to at least one embodiment, the emitter layers directly succeed each other in the organic layer stack. That means that no other layers, which are not provided for a radiation emission, are located between adjacent emitter layers. Such other functional layers can, for instance, be formed by charge carrier generation layers, CGL for short. For instance, an alternative possibility to this end is that a charge carrier generation layer is formed between the emitter layers.

A method described herein and an organic light-emitting diode described herein are explained in more detail in the following with reference to the drawing on the basis of embodiments. Identical reference signs indicate identical elements in the individual illustrations. However, no true-to-scale references are made; instead individual elements may be shown in an exaggeratedly enlarged manner for the sake of better understanding.

Figure 2:
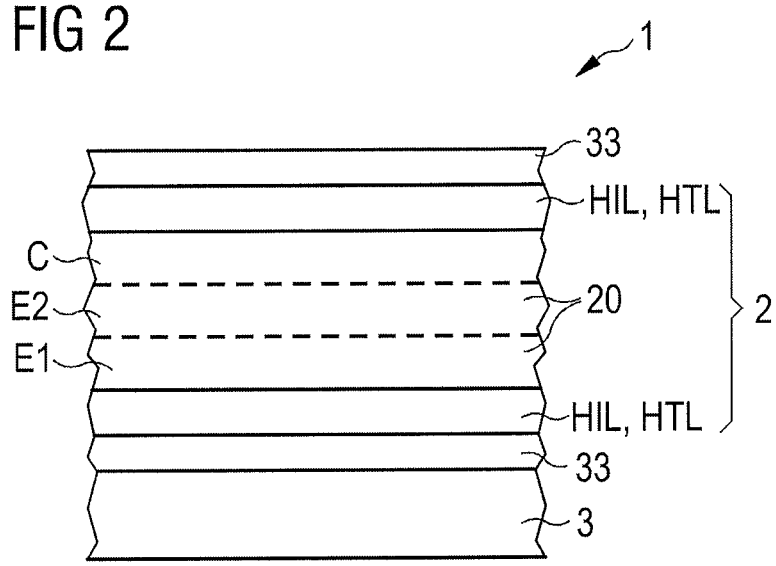

Shown are:

FIG. 1 a schematic diagram of a production method for an organic light-emitting diode described herein, and FIG. 2 a schematic sectional view of an embodiment of an organic light-emitting diode described herein.

FIGS. 1A and 1C show schematic sectional views of procedural steps for producing an embodiment of an organic light-emitting diode 1.

According to FIG. 1A, an electrode 33, a hole injection layer HIL as well as a hole transport layer HTL are applied to a carrier 3, for example a glass plate. The electrode 33 is in particular an anode. Said anode is preferably shaped of a transparent conductive oxide, such as indium tin oxide. The hole injection layer HIL and the hole transport layer HTL are optional.

A solution S is applied to a side of the hole transport layer HTL facing away from the carrier 3. The solution S comprises a solvent L, a matrix material M, as well as three emitter materials E1, E2, E3. The solvent L is preferably a polar, hardly volatile and slowly vaporizing solvent, in which all components can be easily dissolved. Phenetole is used as a solvent, for example. A boiling point of the used solvent preferably equals at least 100° C. or 140° C., at normal pressure. A mass fraction of the components M, E1, E2, E3 dissolved in the solvent L preferably equals between 0.1% and 1% inclusively. A layer thickness of the applied solution equals, for example, approximately 10 μm.

According to FIG. 1B, the arrangement is applied between two field electrodes 4, as shown in FIG. 1A. Said field electrodes 4 are set up to generate an electrical field F, preferably a static electrical field. An interval between the electrodes 4 is minimal and equals, for example, at least 1.5 mm or 2 mm or 3 mm and/or a maximum of 10 mm or 6 mm or 4 mm. Contrary to the illustration, it is thereby possible that the carrier 3 is in contact with one of the field electrodes 4. However, the carrier 3 and the solution S are preferably separated from the field electrodes 4 by a gap.

During and/or before drying or baking the solution S, an electrical field is applied between the field electrodes 4. A field strength equals, for example, a magnitude of 100 V/mm. The solution L is slowly volatilized during drying and baking. This results in a solid state layer, wherein the emitter materials E1, E2, E3 are embedded in the matrix material M, so that a plurality of emitter layers 20 emerges.

A mass fraction of the emitter materials E1, E2, E3 on the emerging layer, once the solvent L is completely removed, preferably equals at least 0.5% or 1% or 2% and, alternatively or additionally, a maximum of 7.5% or 5%. In other words, a predominant weight proportion of the resulting layer is formed by the matrix material M. For example, matrix materials are used, as stated in the document US 2010/0059740 A1 or US 2013/0046096 A1. The disclosure of said documents in this respect is hereby incorporated by reference.

The resulting, completed organic light-emitting diode 1 is shown in FIG. 1C. To this end, an electron transport layer ETL and an electron injection layer EIL is applied as an optional addition to the completed emitter layers 20. The HIL, HTL, 20, ETL, EIL layers form an organic layer stack 2, in which the emitter layers 20 are embedded. Furthermore, a second electrode 33, in particular a metallic cathode, is applied. Additional layers of the organic light-emitting diode 1, such an encapsulation layers, bus electrodes or electronic components are not illustrated for reasons of simplification.

The three emitter layers 20 result due to the electrical field F applied during the drying of the solvent S, see also FIG. 1C. The negatively charged emitter material E3, for example, is located nearest to the carrier 3, followed by a neutral emitter material E2, for example, and followed thereafter by a positively charged emitter material E1. In deviation to the illustration, it is also possible that more than three emitter layers 20 are separated or that further functional layers are applied to the emitter layers 20 by means of the solution S. In such case, for example, single positively charged, two-fold positively charged and three-fold positively charged components etc. can be present in the solution S to be dried. The materials to be separated then arrange themselves in the electrical field F according to the different charges and/or ion mobilities.

The individual emitter materials E1, E2, E3 are in particular introduced into the solution S with the respectively associated counter ions. Said counter ions preferably have a lower, comparable or a not much higher mobility in the electrical field F in the solution S than the emitter materials E1, E2, E3. This enables said emitter materials E1, E2, E3 to arrange themselves as desired in the electrical field F. This can, for example, be achieved by counter ions with a comparable or larger molecular size than the emitter materials E1, E2, E3.

The light-emitting diode 1 according to FIG. 1C is set up to only emit radiation through the carrier 3. As an alternative, the light-emitting diode 1 can be configured to emit on both sides or to only emit on a side facing the carrier 3. The materials for said carrier 3 as well as the electrodes 33 are to be selected accordingly.

FIG. 2 shows a further exemplary embodiment of the organic light-emitting diode 1. Said light-emitting diode 1 according to FIG. 2 has only two of the emitter layers 20.

The emitter material E1 is, for example, singly negatively charged and the emitter material E2 can be electrically neutral and thus uncharged. This allows the counter ions C for the loaded emitter material E1 to be located with the electrically neutral emitter material E2 on a side of the layer facing away from the carrier 3. An active zone with a plurality of emitter layers 20 can thus be generated with only a single solution S. For example, the emitter layers 20 for generating blue light and yellow-orange light are set up in such a way as to generate white mixed light. The individual emitter materials are thereby only present in the associated emitter layer 20 in a demixed state.

Such a production method, as illustrated in conjunction with FIG. 1, thus allows an organic light-emitting diode with a plurality of emitter layers 20 to be generated by a single, wet-processing step and by a single, joint solvent in a joint matrix material. This enables any vaporization of individual layers, specifically in an active zone, to be avoided. This goes hand in hand with increased productivity and reduced costs.

In particular, it allows the liquid phase processing for the organic light-emitting diode to be simplified. The emitter layers 20 need not be separated one after another, and can instead be separated in a single step. This joint separation allows any dissolution of previously already separated wet-processed layers to be avoided. This in turn allows the duration of the process to be reduced.

Compared with a completely mixed layer without separation of the different emitter materials, this results in continued higher internal quantum efficiency of the emitter materials, specifically also due to the fact that the emitter materials can be positioned in an optical maximum in a microcavity. In particular, the Purcell effect can be exploited.

A higher out-coupling efficiency or external quantum efficiency is also realisable. The demixing of the emitter molecules also allows a reduction in the quenching mechanisms and in undesired energy transitions between different emitter molecules to be achieved. Overall, this application method thus allows an increased light output to be achieved compared with mixed systems.

In addition, this application opens up different ionic emitter materials to wet processing for generating the emitter layers. In particular, Os (II)-Triplet-Emitters can be used. It is thus enabled an optimization of the organic light-diode with regard to the used materials.

The invention described herein is not restricted by the description on the basis of the exemplary embodiments. Instead, the invention comprises every new feature as well as every combination of features, which in particular includes every combination of features in the claims, even if such feature or combination is not itself explicitly stated in the claims or exemplary embodiments.

This patent application claims the priority of the German patent application 10 2014 101 650.5, the disclosure of which is hereby incorporated by reference.

The invention claimed is:

1. Method for producing an organic light-emitting diode comprising the steps:
   providing a carrier for the organic light-emitting diode,
   applying a solution (S) comprising a plurality of different emitter materials (E) to the carrier, wherein said emitter materials (E) are each formed by a certain type of organic molecules and have electrical charges that differ from each other,
   applying an electrical field (F), so that the solution (S) is located in the electrical field (F), and
   drying the solution (S) into a plurality of emitter layers in an organic layer stack, while the electrical field (F) is applied, so that the emitter materials (E) are accommodated separately from each other, each in a certain emitter layer of the organic stack.

2. Method according to claim 1,
   in which the solution (S) comprises an organic matrix material (M), the emitter materials (E) and counter ions (C) for at least one of the emitter materials (E) as well as a solvent (L), wherein all emitter layers of the organic light-emitting diode are generated from the precisely one solution (S).

3. Method according to claim 2,
   in which the solvent (L) is an aryl-alkyl-ether or an alicyclic diether.

4. Method according to claim 2,
   in which the ion mobilities of the counter ions (C) and of the associated emitter materials (E) deviate from each other by a maximum of 25% during drying.

5. Method according to claim 2,
   in which the counter ions (C) are at least partially formed by $PF_6^-$.

6. Method according to claim 1,
   in which at least one of the emitter materials (E) is a metal complex of the formula $[(L_{CH})_x MX_y]^{n-}$ or $[(L_{CH})_x MX_y]^{n+}$,
   wherein M is a metallic ion from the group Mo, Ru, Rh, Pd, Ag, W, Re, Os, Ir, Pt, Cu, Au and lanthanides,
   wherein $L_{CH}$ is in each case an independent bidentate chelating ligand,
   wherein X is in each case an independent single negatively charged monodentate ligand from the group Cl, Br, I, CN, SCN and/or OCN is, and wherein n, x and y are integers with $1 \leq x \leq 3$, $0 \leq y \leq 6$ and $1 \leq n \leq 4$.

7. Method according to claim 1,
   in which at least one of the emitter materials (E) is a metal complex compound, which comprises at least one metallic central atom (M) and at least one ligand coordinated by the metallic central atom M, which is a bidentate ligand with at least one aromatic unit, wherein an imidazolinium unit is bound to the or to one of the aromatic units via a spacer, so that a charged complex results, which binds an anion:

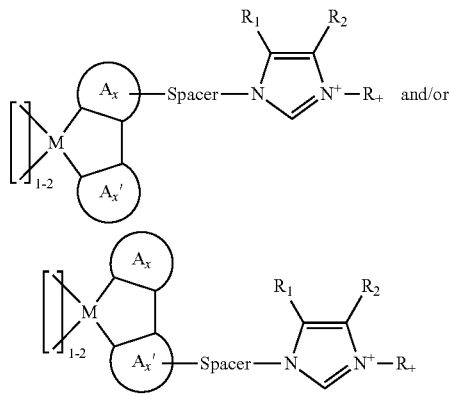

wherein M is selected from the group Mo, Ru, Rh, Pd, Ag, W, Re, Os, Ir, Pt, Cu, Au and lanthanides,
wherein the anion is freely selectable,
wherein the ligands

are formed independently of each other analogous to the imidazolinium substituted ligands "Ax-Spacer-Imidazol" or are selected from cyclo metallizing ligands,
wherein Ax, Ax' is a substituted or unsubstituted aromatic or heteroaromatic, which is capable of bond relations to the metallic central atom M,
wherein a bond of the metallic central atom to a carbon or nitrogen of the Ax and of the Ax' is represented by a solid line,
wherein a bond of the metallic central atom to either a carbene carbon or a nitrogen or phosphor coordinated by a free pair of electrons is represented by a dashed line,
wherein
a) aliphatic chains such as $-(CH_2)_n-$ wherein n=1 to 20,
b) fluorinated alkyl chains with 1 to 12 carbon atoms in the chain,
c) unsaturated alkyl chains with 1 to 20 carbon atoms and conjugated or non-conjugated double bonds,
d) unsaturated alkyl chains with 1 to 20 carbon atoms and conjugated or non-conjugated triple bonds, also in conjunction with aromatics,
e) a polyethylene glycol, polyethylene diamine, polyester, polyurethane or polyvinylidene phenyl chain,
f) chains containing aromatics, or
g) mixed variants of a to f,
are used as spacers, $R_1$, $R_2$, $R_+$ are selected independently of each other from the following group: H, branched alkyl radicals, unbranched alkyl radicals, condensed alkyl radicals, cyclic alkyl radicals, fully or partially substituted unbranched, branched, condensed and/or cyclic alkyl radicals, alkoxy groups, amines, amides, esters, ethers, carbonates, aromatics, fully or partially substituted aromatics, heteroaromatics, condensed aromatics, fully or partially substituted condensed aromatics, heterocycles, fully or partially substituted heterocycles, condensed heterocycles, halogens, pseudohalogens, condensed alkyl radicals or fully or partially substituted alkyl radicals.

8. Method according to claim 1,
in which at least one of the emitter materials (E) is selected from the group:

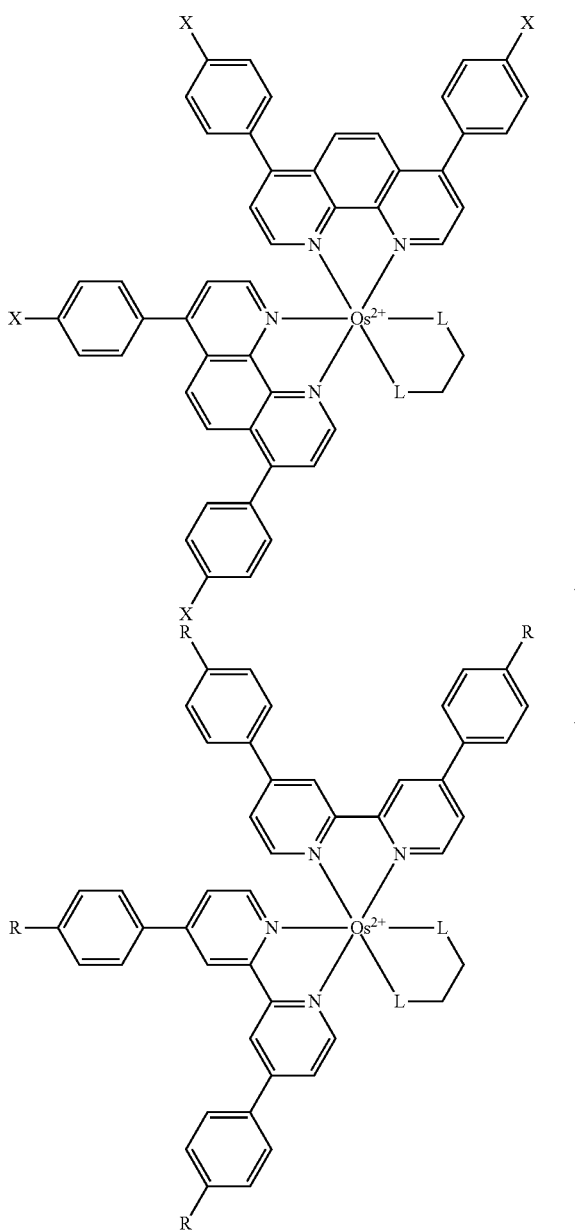

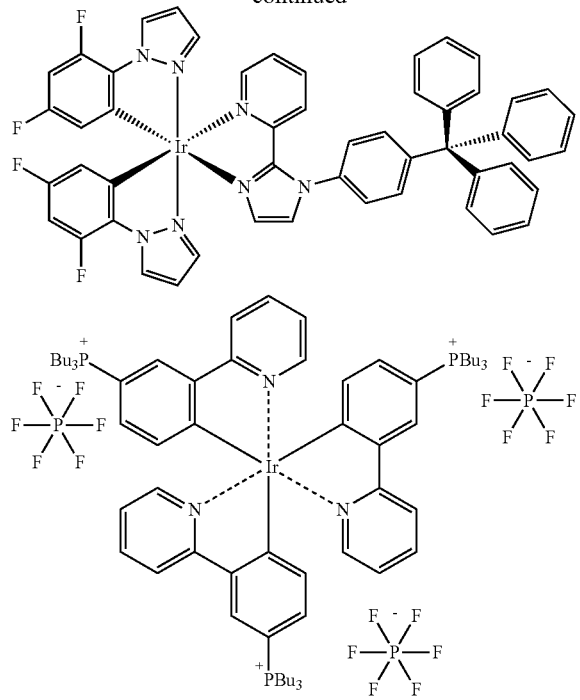

wherein R, X are selected independently of each other from the following group: H, branched alkyl radicals, unbranched alkyl radicals, condensed alkyl radicals, cyclic alkyl radicals, fully or partially substituted unbranched, branched, condensed and/or cyclic alkyl radicals, alkoxy groups, amines, amides, esters, ethers, carbonates, aromatics, fully or partially substituted aromatics, heteroaromatics, condensed aromatics, fully or partially substituted condensed aromatics, heterocycles, fully or partially substituted heterocycles, condensed heterocycles, halogens, pseudohalogen, condensed alkyl radicals or fully or partially substituted alkyl radicals, wherein the charged residue groups $-PBu_3^+$ can be replaced independently of each other by other charged residue groups, such as $-NR_3^+$, $-SO_3^-$, $P(R)_3^+$, $-COO^-$, $-P(OR)_4^{2-}$, and wherein Ir as well as Os can be replaced by Mo, Ru, Rh, Pd, Ag, W, Re, Pt, Cu, Au and lanthanides.

9. Method according to claim 1,
in which the solution (S) comprises an emitter material (E) for generating a blue light, an emitter material for generating a green light and an emitter material for generating a red light.

10. Method according to claim 1,
in which the solution (S) is applied with a layer thickness of between 2 μm and 50 μm inclusively,
wherein dissolved components in the solution (S) make up a mass fraction of between 0.1% and 3% inclusively of the total solution (S).

11. Method according to claim 1,
in which an electrical field strength of the electrical field (F) equals between 50 V/mm and 500 V/mm inclusively during drying,
wherein the electrical field (F) is a static electrical field.

* * * * *